(12) United States Patent
Kim et al.

(10) Patent No.: US 8,643,045 B2
(45) Date of Patent: Feb. 4, 2014

(54) LIGHT EMITTING DEVICE

(75) Inventors: SoJung Kim, Seoul (KR); HwanHee Jeong, Seoul (KR); DukHyun Park, Seoul (KR); JuneO Song, Seoul (KR); KwangKi Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 9 days.

(21) Appl. No.: 13/280,669

(22) Filed: Oct. 25, 2011

(65) Prior Publication Data

US 2012/0037945 A1 Feb. 16, 2012

(30) Foreign Application Priority Data

Oct. 27, 2010 (KR) .......................... 10-2010-0105399

(51) Int. Cl.
*H01L 33/00* (2010.01)
(52) U.S. Cl.
USPC .............................................. 257/98; 257/13

(58) Field of Classification Search
USPC ...................................................... 257/98, 13
See application file for complete search history.

(56) References Cited

U.S. PATENT DOCUMENTS

| 8,283,687 B2 * | 10/2012 | Lee .................................. 257/98 |
| 2005/0184300 A1 * | 8/2005 | Tazima et al. ................... 257/94 |
| 2007/0114545 A1 * | 5/2007 | Jang et al. ....................... 257/94 |

* cited by examiner

*Primary Examiner* — Douglas Menz
(74) *Attorney, Agent, or Firm* — KED & Associates, LLP (57) ABSTRACT

Disclosed is a light emitting structure comprising a first semiconductor layer, a substrate, a reflection electrode disposed on the substrate, a light transmitting electrode disposed on the reflection electrode, and a light emitting structure disposed on the light transmitting electrode, the light emitting structure comprising a first semiconductor layer, a second semiconductor layer, and an active layer interposed between the first and second semiconductor layer. The light transmitting electrode has a thickness of 20 to 200 Å.

16 Claims, 9 Drawing Sheets

LIGHT EMITTING DEVICE

CROSS-REFERENCE TO RELATED APPLICATION

This application claims the priority benefit of Korean Patent Application No. 10-2010-0105399, filed on in Korea Oct. 27, 2010, the disclosure of which is incorporated herein by reference.

BACKGROUND OF THE EMBODIMENT

1. Field

This relates to a light emitting device.

2. Background

Generally, a light emitting diode (LED) as a light emitting device is a semiconductor device, which emits light in accordance with recombination of electrons and holes. Such an LED is widely used as a light source in optical communications, electronic appliances, etc.

The frequency (or wavelength) of light emitted from an LED is a function of the bandgap of a material used in the LED. When a semiconductor material having a narrow bandgap is used, photons of high energy and long wavelengths are generated. On the other hand, when a semiconductor material having a wide bandgap is used, photons of short wavelengths are generated.

For example, an AlGaInP material generates light of red wavelengths is generated. On the other hand, silicon carbide (SiC) and Group-III nitride-based semiconductor, in particular, GaN, generate light of blue or ultraviolet wavelengths.

Recently, light emitting devices are required to have high brightness so that they may be used as light sources for illumination. In order to achieve such high brightness, research into manufacture of a light emitting device capable of achieving uniform current diffusion, and thus, an enhancement in light emission efficiency, is being conducted.

BRIEF DESCRIPTION OF THE DRAWINGS

The embodiments will be described in detail with reference to the following drawings in which like reference numerals refer to like elements wherein.

DETAILED DESCRIPTION

Reference will now be made in detail to the preferred embodiments, examples of which are illustrated in the accompanying drawings.

Advantages and characteristics and methods for addressing the same will be clearly understood from the following embodiments taken in conjunction with the annexed drawings. However, embodiments are not limited and may be realized in other various forms. The embodiments are only provided to more completely illustrate and to render a person having ordinary skill in the art to fully understand the scope. The scope is defined only by the claims. Accordingly, in some embodiments, well-known processes, well-known device structures and well-known techniques are not illustrated in detail to avoid unclear interpretation. The same reference numbers will be used throughout the specification to refer to the same or like parts.

Spatially relative terms, "below", "beneath", "lower", "above", "upper" and the like may be used to indicate the relationship between one device or constituent elements and other devices or constituent elements, as shown in the drawings. It should be understood that the spatially relative terms include the direction illustrated in the drawings as well as other directions of devices during use or operation. For example, in a case in which the device shown in the drawing is reversed, a device arranged "below" or "beneath" the other device may be arranged "above" the other device. Accordingly, the exemplary term, "beneath" may include "below" or "beneath" and "above". The device may be arranged in other directions. As a result, the spatially relative terms may be construed depending on orientation.

Terms used in the specification are only provided to illustrate the embodiments and should not be construed as limiting the scope and spirit of the present invention. In the specification, a singular form of terms includes plural forms thereof, unless specifically mentioned otherwise. In the term "comprises" and/or "comprising" as used herein, the mentioned component, step, operation and/or device is not excluded from presence or addition of one or more other components, steps, operations and/or devices.

Unless defined otherwise, all terms (including technical and scientific terms) used herein may be intended to have meanings understood by those skilled in the art. In addition, terms defined in general dictionaries should not be interpreted abnormally or exaggeratedly, unless clearly specifically defined.

In the drawings, the thicknesses or sizes of respective layers are exaggerated, omitted or schematically illustrated for clarity and convenience of description. Therefore, the sizes of respective elements do not wholly reflect actual sizes thereof.

In addition, angles and directions referred to during description of a structure of a light emitting device are described based on illustration in the drawings. In the description of the structure of the light emitting device, if reference points with respect to the angles and positional relations are not clearly stated, the related drawing will be referred to.

Hereinafter, for further detailed illustration of the shape of the light emitting device according to embodiments, the light emitting device will be described based on a first direction (X) and a second direction (Y) vertical to the first direction (X).

Figure 1:
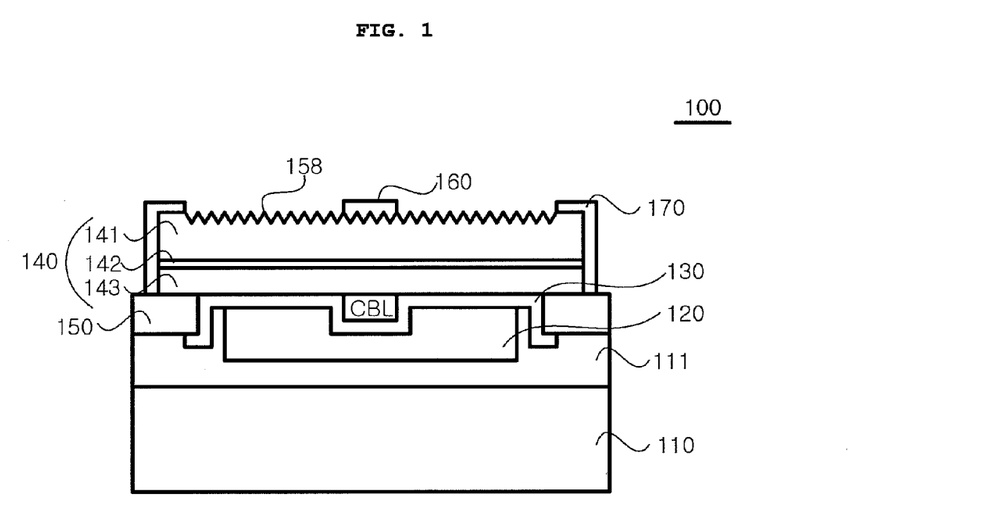
FIG. 1 is a cross-sectional view illustrating a light emitting device in accordance with an embodiment as broadly described herein.

FIG. 1 is a cross-sectional view illustrating a light emitting device in accordance with an embodiment as broadly described herein.

With reference to FIG. 1, the light emitting device 100 as embodied and broadly described herein may include a substrate 110, a reflection electrode 120 disposed on the substrate 110, a light transmitting electrode 130 disposed on the reflection electrode 120, and a light emitting structure 140 disposed on the light transmitting electrode 130.

The substrate 110 may be made of a material having excellent thermal conductivity. For example, the substrate 110 may be made of a metal material or a conductive ceramic.

The substrate 110 may have a single-layer structure. Alternatively, the substrate 110 may have a double-layer structure or a multilayer structure having three or more layers.

Although the substrate 110 in the illustrated embodiment has been described as having conductivity, the present disclosure is not limited thereto. For example, the substrate 110 may be nonconductive.

When the substrate 110 is made of a metal material, the material of the substrate 110 may be one selected from gold (Au), nickel (Ni), tungsten (W), molybdenum (Mo), copper (Cu), aluminum (Al), tantalum (Ta), silver (Ag), platinum (Pt), chromium (Cr), and alloys thereof. The substrate 110 may be formed by laminating two or more layers of different materials.

The substrate 110 functions to easily dissipate heat generated from the light emitting device 100, and thus to achieve an enhancement in thermal stability.

When the substrate 110 is made of a semiconductor material, the material of the substrate 110 may be formed using a carrier wafer such as silicon (Si), germanium (Ge), gallium arsenide (GaAs), zinc oxide (ZnO), silicon carbide (SiC), silicon germanium (SiGe), gallium nitride (GaN), or gallium oxide ($Ga_2O_3$).

The substrate 110 functions to easily dissipate heat generated from the light emitting device 100, and thus to achieve an enhancement in thermal stability.

A bonding layer 111 may be laminated over the substrate 110. The bonding layer 111 is formed to prevent the light transmitting electrode 130 from being exposed to the atmosphere while minimizing an electromigration phenomenon in which atoms in the light transmitting electrode 130 migrate due to electric field during application of current.

The bonding layer 111 may be made of at least one of a metal material exhibiting excellent bonding force to the material of an under layer and an adhesive.

The metal material, which exhibits excellent bonding force to be used for the bonding layer 111, may include, for example, indium (In), tin (Sn), silver (Ag), niobium (Nb), nickel (Ni), aluminum (Au), and copper (Cu). The bonding layer 111 may be made of at least one of the metal materials, and may have a single-layer structure or a multilayer structure.

The reflection electrode 120 is disposed on the bonding layer 111. The reflection electrode 120 may be formed, at a central portion thereof, with a groove (not shown), in which a current blocking layer (CBL) will be disposed. The reflection electrode 120 may be thicker than the light transmitting electrode 130.

The current blocking layer CBL is provided to avoid current crowding in which electrons are concentrated at a region beneath an electrode pad 160 formed on the light emitting structure 140 when a first semiconductor layer 141 of the light emitting structure 140 is an n-type semiconductor layer.

The current blocking layer CBL may be made of silicon dioxide ($SiO_2$) or aluminum oxide ($Al_2O_3$) containing silicon dioxide ($SiO_2$).

The light transmitting electrode 130 is disposed on the reflection electrode 120. The light transmitting electrode 130 may be arranged such that it is partially in contact with opposite side surfaces of the reflection electrode 120. The light transmitting electrode 130 may have a greater width than the reflection electrode 120.

The light transmitting electrode 130 may have bent portions extending in parallel with the side surfaces of the reflection electrode 120 while being spaced apart from the side surfaces of the reflection electrode 120, respectively. Of course, the light transmitting electrode 130 is not limited to such a structure.

The light transmitting electrode 130 may be made of a material having light transmittance, for example, at least one of nickel (Ni), platinum (Pt), ruthenium (Ru), iridium (Ir), rhodium (Rh), tantalum (Ta), molybdenum (Mo), titanium (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO), and indium zinc oxide (IZO) or an alloy thereof.

The light transmitting electrode 130 may have a thickness of 20 to 200 Å.

That is, when the light transmitting electrode 130 is formed using a material having light transmittance, to have a thickness exceeding 200 Å, in particular, even in the case in which the light transmitting electrode 130 is a transparent electrode, there may be loss of light reflected by the reflection electrode 120. On the other hand, when the light transmitting electrode 130 has a thickness less than 20 Å, there may be a problem in manufacturing processes. In addition, the light transmitting electrode 130 may be damaged.

When the light transmitting electrode 130 has a thickness of 50 Å, it may be possible to prevent occurrence of a problem in manufacturing processes and damage of the light transmitting electrode 130. Also, it may be possible to stably increase optical power.

The following Table 1 represents optical powers according to various thicknesses of the light transmitting electrode 130.

That is, Table 1 represents optical output rates at thicknesses of 500 Å and 200 Å of the light transmitting electrode 130. On the other hand, Table 2 represents optical output rates at thicknesses of 200 Å and 50 Å of the light transmitting electrode 130.

TABLE 1

| Thickness of Electrode Layer | 200 Å | 500 Å | Optical Power (%) |
| --- | --- | --- | --- |
| 1 (Optical Power) | 335.98 | 326.63 | 102.9% |
| 2 (Optical Power) | 338.39 | 326.70 | 103.6% |
| 3 (Optical Power) | 336.63 | 326.65 | 103.1% |
| 4 (Optical Power) | 337.67 | 327.65 | 103.1% |
| 5 (Optical Power) | 337.43 | 327.25 | 103.1% |
| Average (Optical Power) | 337.22 | 326.98 | 103.1% |

In detail, Table 1 represents rates of optical powers at 200 Å with respect to optical powers at 500 Å when it is assumed that the optical powers at 500 Å are 100%, which are obtained by preparing 5 samples each having a thickness of 500 Å and a thickness of 200 Å at opposite sides of a central portion thereof, and measuring optical powers for the samples at each thickness.

Referring to Table 1, it may be seen that, when the light transmitting electrode 130 has a reduced thickness of 200 Å, the total optical power rate is increased 3.1%, as compared to the case in which the light transmitting electrode 130 has a thickness of 500 Å.

TABLE 2

| Thickness of Electrode Layer | 50 Å | 200 Å | Optical Power (%) |
| --- | --- | --- | --- |
| 1 (Optical Power) | 324.45 | 314.45 | 103.2% |
| 2 (Optical Power) | 323.99 | 314.72 | 102.9% |
| 3 (Optical Power) | 323.69 | 313.92 | 103.1% |

TABLE 2-continued

| Thickness of Electrode Layer | 50 Å | 200 Å | Optical Power (%) |
|---|---|---|---|
| 4 (Optical Power) | 324.19 | 313.17 | 103.5% |
| 5 (Optical Power) | 323.65 | 311.42 | 103.9% |
| Average (Optical Power) | 323.99 | 315.54 | 103.3% |

In detail, Table 2 represents rates of optical powers at 50 Å with respect to optical powers at 200 Å, which are obtained by preparing 5 samples each having a thickness of 200 Å and a thickness of 50 Å at opposite sides of a central portion thereof, and measuring optical powers for the samples at each thickness. Table 2 represents the measured optical power rates in the same manner as Table 1.

Referring to Table 2, it may be sent that, when the light transmitting electrode 130 has a reduced thickness of 50 Å, the total optical power rate is increased by about 6%, as compared to the case in which the light transmitting electrode 130 has a thickness of 500 Å.

When the results of Tables 1 and 2 are integrated, it may be seen that, when the light transmitting electrode 130 has a thickness of 50 Å, the total optical power rate is increased 3.3%, as compared to the case in which the light transmitting electrode 130 has a thickness of 200 Å.

Thus, it may be possible to enhance optical power or light efficiency by reducing the thickness of the light transmitting electrode 130.

A channel layer 150 may be formed at regions corresponding to opposite lateral ends of the reflection electrode 120 and light transmitting electrode 130. The channel layer 150 may be arranged at an outer peripheral region of the light emitting structure 140.

At least a portion of the channel layer 150 may be disposed on the light transmitting electrode 130 to overlap with the light transmitting electrode 130.

The channel layer 150 may be made of at least one of a metal material and an insulating material. For the metal material, a material exhibiting lower electrical conductivity than the light transmitting electrode 130 at a region where the material contacts the light emitting structure 140 may be used. The channel layer 150 may form Schottky contacts in conjunction with the light emitting structure 140.

The channel layer 150 may be made of a material exhibiting lower electrical conductivity than the material of the light transmitting electrode 130 so that the voltage applied to the light transmitting electrode 130 is not applied to the channel layer 150.

The material of the channel layer 150 may include at least one of titanium (Ti), nickel (Ni), platinum (Pt), lead (Pb), rhodium (Rh), iridium (Ir), and tungsten (W), at least one of aluminum oxide ($Al_2O_3$), silicon oxide ($SiO_2$), silicon nitride ($Si_3N_4$), and titanium oxide ($TiO_x$), or at least one of indium tin oxide (ITO), aluminum zinc oxide (AZO), and indium zinc oxide (IZO).

The light emitting structure 140 is in contact with the light transmitting electrode 130 and channel layer 150. The light emitting structure 140 may include, in addition to the first semiconductor layer 141, an active layer 142 and a semiconductor layer 143. The active layer 142 is interposed between the first and second semiconductor layers 141 and 143.

The first semiconductor layer 141 may be implemented by an n-type semiconductor layer. The n-type semiconductor layer may be made of one of GaN-based compound semiconductor materials such as GaN, AlGaN, and InGaN, and may be doped with an n-type dopant.

Meanwhile, the electrode pad 160 is formed on the first semiconductor layer 141, using nickel (Ni) or the like. Irregularities 158 may be formed at a surface portion of the first semiconductor layer 141 where the electrode pad 160 is not formed or at the entire surface portion of the first semiconductor layer 141, using a certain etching method, in order to achieve an enhancement in light extraction efficiency.

In this case, the electrode pad 160 may be formed on a flat upper surface of the first semiconductor layer 141 where the irregularities 150 are not formed, or may be formed on an upper surface of the first semiconductor layer 141 where the irregularities 150 are formed. That is, the electrode pad 160 is not limited to the above-described conditions.

The active layer 142 may be disposed beneath the first semiconductor layer 141. The active layer 142 is a region where electrons and holes are recombined. In accordance with recombination of electrons and holes, the active layer 142 transits to a lower energy level, so that it may generate light having a wavelength corresponding to the energy level.

The active layer 142 may be made of, for example, a semiconductor material having a formula of $In_xAl_yGa_{1-x-y}N$ ($0 \leq x \leq 1$, $0 \leq y \leq 1$, and $0 \leq x+y \leq 1$). The active layer 142 may have a single quantum well structure or a multi-quantum well (MQW) structure.

The well structure may be made of a material having a lower bandgap than a barrier layer.

The active layer 142 may include a quantum wire structure or a quantum dot structure.

The second semiconductor layer 143 may be disposed beneath the active layer 142. The second semiconductor layer 143 may be implemented by a p-type semiconductor layer. In this case, the second semiconductor layer 143 may inject holes into the active layer 142. The p-type semiconductor layer may be made of, for example, a semiconductor material having a formula of $In_xAl_yGa_{1-x-y}N$ ($0 \leq x \leq 1$, $0 \leq y \leq 1$, and $0 \leq x+y \leq 1$), for example, GaN, AlN, AlGaN, InGaN, InN, InAlGaN, or AlInN. The p-type semiconductor layer may be doped with a p-type dopant such as Mg, Zn, Ca, Sr, and Ba.

A third semiconductor layer (not shown) may be formed beneath the second semiconductor layer 143. The third semiconductor layer may be implemented by an n-type semiconductor layer.

Meanwhile, the first semiconductor layer 141, active layer 142, and second semiconductor layer 143 may be formed using a metal organic chemical vapor deposition (MOCVD) method, a chemical vapor deposition (CVD) method, a plasma-enhanced chemical vapor deposition (PECVD) method, a molecular beam epitaxy (MBE) method, a hydride vapor phase epitaxy (HVPE) method, or a sputtering method. Of course, the formation method is not limited to the above-described methods.

Contrary to the above-described embodiment, the first semiconductor layer 141 may be implemented by a p-type semiconductor layer, and the second semiconductor layer 143 may be implemented by an n-type semiconductor layer. Of course, the disclosure is not limited to this embodiment.

Again referring to FIG. 1, a passivation layer 170 may be formed on side surfaces of the light emitting structure 140. The passivation layer 170 may be made of silicon oxide ($SiO_2$), silicon nitride ($Si_3N_4$), or the like. The passivation layer 170 may extend from upper surface portions of the channel layer 150 not vertically overlapping with the light emitting structure 140 to corresponding upper surface portions of the first semiconductor layer 141 along the corresponding side surfaces of the light emitting structure 140.

FIGS. 2 to 7 are sectional views illustrating sequential processes of the method for manufacturing of the light emitting device shown in FIG. 1.

Figure 2:
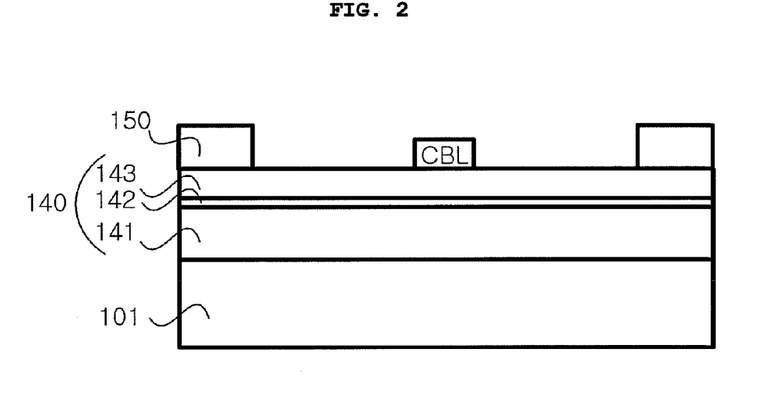
FIGS. 2 to 7 are sectional views illustrating sequential processes of the method for manufacturing of the light emitting device shown in FIG. 1.

With reference to FIG. 2, the light emitting device 140 is disposed on a separable growth substrate 101.

The growth substrate 101 may be made of a material selected from the group consisting of sapphire ($Al_2O_3$), GaN, SiC, ZnO, Si, GaP, InP, and GaAs, Although not shown, a buffer layer (not shown) may be formed between the growth substrate 101 and the light emitting structure 140.

The buffer layer (not shown) may be made of a combination of Group-III and Group-V elements. For example, the buffer layer may be made of GaN, InN, AlN, InGaN, AlGaN, InAlGaN, and AlInN. The buffer layer may be doped with a dopant.

An undoped semiconductor layer (not shown) may be formed over the growth substrate 101 or the buffer layer (not shown). One or both of the buffer layer (not shown) and undoped semiconductor layer (not shown) may be formed or omitted. The disclosure is not limited to such structures.

The light emitting structure 140 may include the first semiconductor layer 141, the second semiconductor layer 143, and the active layer 142, which is interposed between the first and second semiconductor layers 141 and 143. This structure is identical to the structure described with reference to FIG. 1 and, as such, no detailed description thereof will be given.

The channel layer 150 and current blocking layer CBL may be disposed on the second semiconductor layer 143. The channel layer 150 may be thicker than the current blocking layer CBL. Of course, the disclosure is not limited to such structures.

Figure 3:
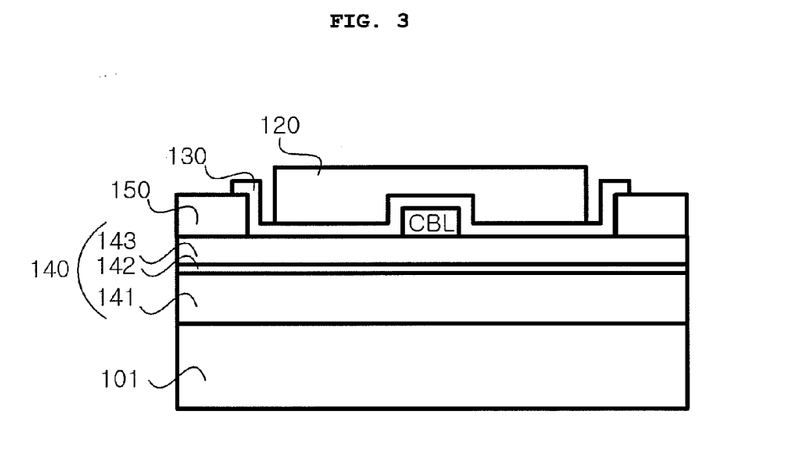

With reference to FIG. 3, simultaneous formation of the light transmitting electrode 130 and reflection electrode 120 is shown. That is, the light transmitting electrode 130 and reflection electrode 120 are continuously formed using a sputtering method or the like, and are then simultaneously cured. When the light transmitting electrode 130 and reflection electrode 120 are formed through simultaneous curing, it may be possible to enhance the bonding force between the light transmitting electrode 130 and reflection electrode 120.

The light transmitting electrode 130 is disposed on the second semiconductor layer 143 and current blocking layer CBL. The light transmitting layer 130 may partially contact one side surface of the channel layer 150 and an upper surface of the channel layer 150. Of course, the disclosure is not limited to this structure.

The light transmitting electrode 130 may have a thickness of 20 to 200 Å.

The reflection electrode 120 may have a flat surface or irregularities (not shown) at a surface opposite to the light transmitting electrode 130, namely, at a back surface not contacting the light transmitting electrode 130. Of course, the reflection electrode 120 is not limited to such structures. When the reflection electrode 120 has irregularities at the back surface thereof, it may be possible to enhance the effect of extracting light generated from the light emitting structure 140.

Figure 4:
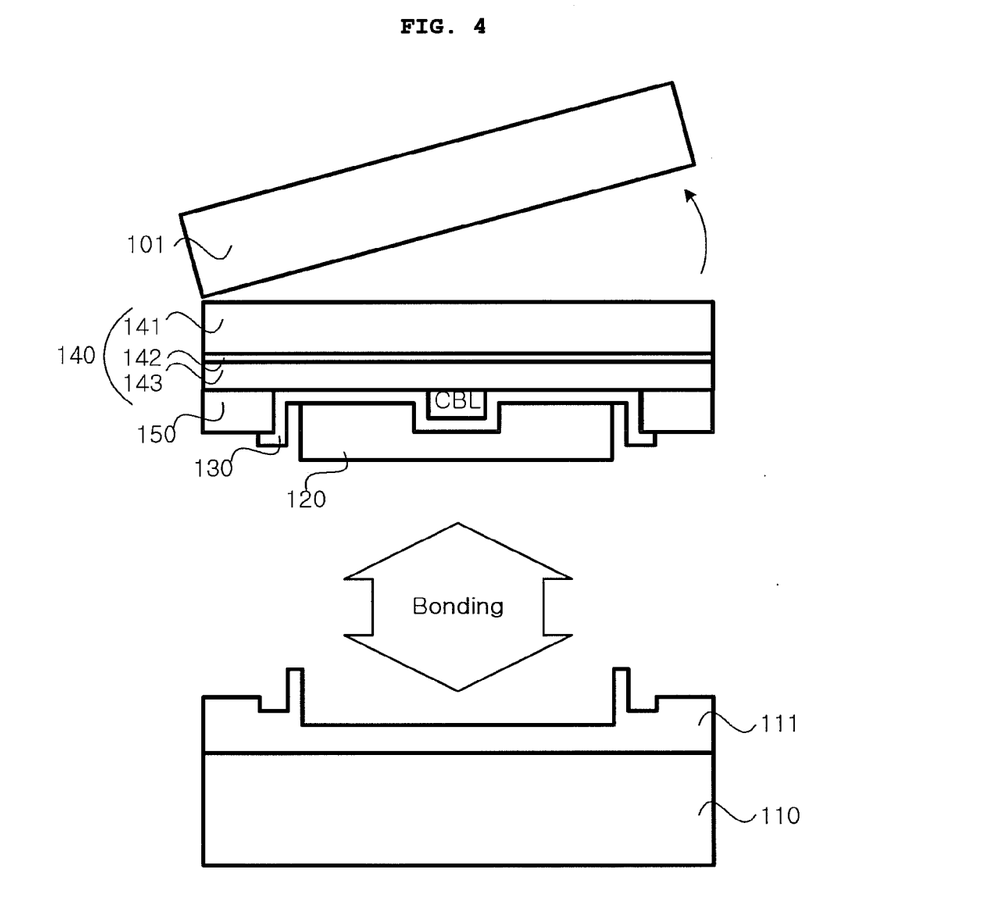

With reference to FIG. 4, the substrate 110 may be arranged over the substrate 110. A current diffusion layer, which may be the bonding layer 111, may be interposed between the substrate 110 and the reflection electrode 120.

Once the substrate 110 is bonded to the reflection electrode 120, it is disposed as a base. Thereafter, the growth substrate 101 is removed.

The growth substrate 101 may be removed using a physical and/or chemical method. As to the physical method, for example, a laser lift-off (LLO) method may be used. Meanwhile, although not shown, the buffer layer (not shown) disposed on the light emitting structure 140 may be removed after removal of the growth substrate 101. In this case, the buffer layer may be removed through a dry or wet etching method or a polishing method.

Figure 5:
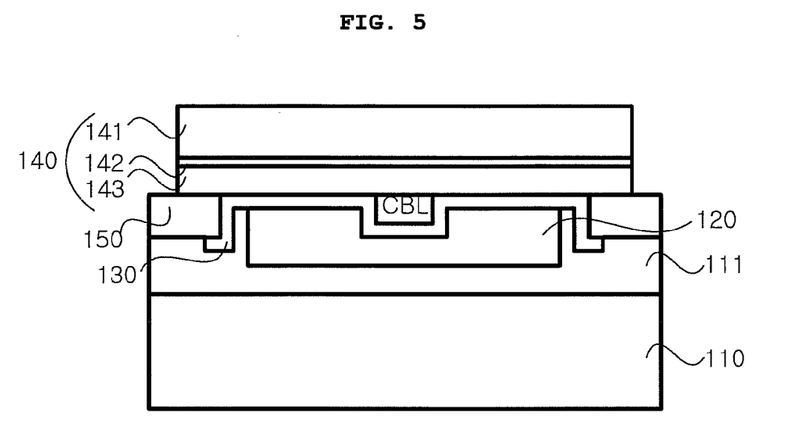
Figure 6:
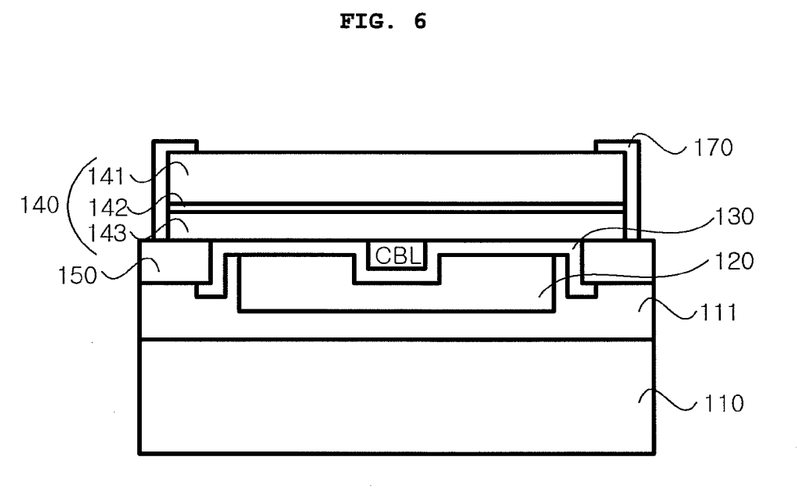

With reference to FIGS. 5 and 6, mesa etching may be carried out for outside regions of the light emitting structure 140, and the passivation layer 170 may then be formed on the resulting structure. In accordance with the mesa etching of the light emitting structure 140, the width of the reflection electrode 120 may be narrower than the width of the active layer 142. Of course, the disclosure is not limited to this condition.

The passivation layer 170 may be made of an insulating material. The passivation layer 170 may extend from upper surface portions of the channel layer 150 not vertically overlapping with the light emitting structure 140 to corresponding upper surface portions of the first semiconductor layer 141 along the corresponding side surfaces of the light emitting structure 140.

Figure 7:
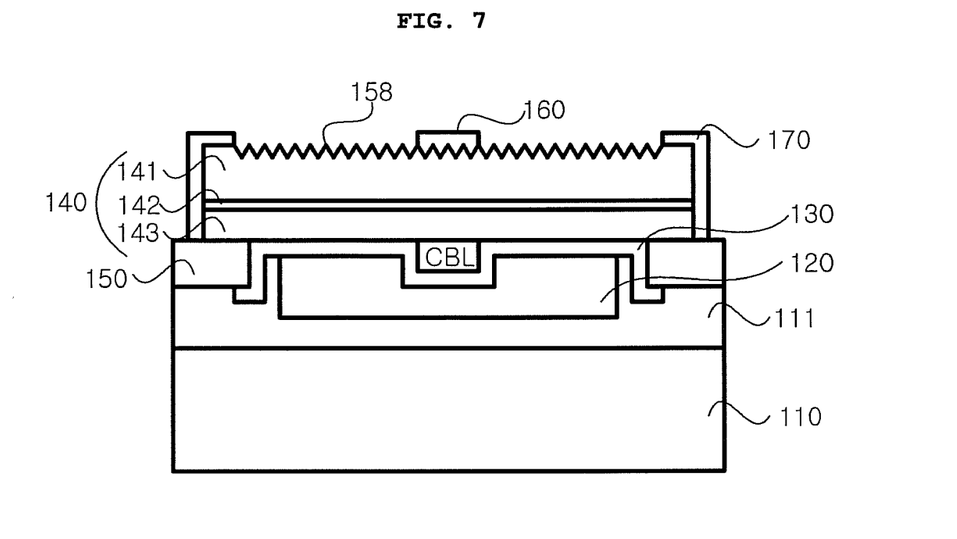

With reference to FIG. 7, the irregularities 158 may be formed at a surface portion of the first semiconductor layer 141 or over the entire surface of the first semiconductor layer 141, using a certain etching method. The electrode pad 160 is then formed on the resulting surface of the first semiconductor layer 141.

The irregularities may be dispensed with. When the irregularities are formed, they are not limited to the structure shown in FIG. 7.

Meanwhile, the electrode pad 160 may be formed at a position corresponding to the current blocking layer CBL. When the electrode pad 160 is arranged at a position corresponding to the current blocking layer CBL, it may be possible to avoid an electron crowding phenomenon in which electrons are concentrated at a region beneath the electrode pad 160.

Figure 8:
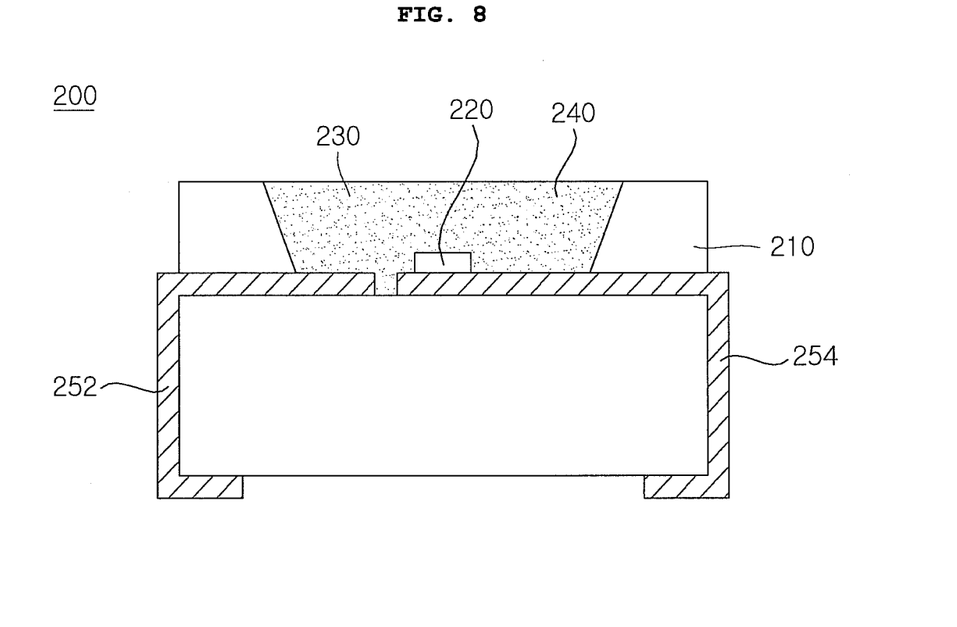
FIG. 8 is a cross-sectional view illustrating a light emitting device package including a light emitting device shown in FIG. 1.

FIG. 8 is a cross-sectional view illustrating a light emitting device package including a light emitting device shown in FIG. 1.

With reference to FIG. 8, the light emitting device package 100 as embodied and broadly described herein may include a body 210 formed with a cavity, a light emitting device 220 mounted on a bottom of the body 210, and a resin material 230 filling the cavity. The resin material 230 may contain a phosphor 240.

The body 210 may be made of at least one of a resins such as polyphthalamide (PPA), silicon (Si), aluminum (Al), aluminum nitride (AlN), liquid crystal polymer such as photo sensitive glass (PSG), polyamide 9T (PA9T), sindiotactic polystyrene (SPS), a metal, sapphire ($Al_2O_3$), beryllium oxide (BeO), and ceramic, or may be a Printed Circuit Board (PCB). The body 210 may be formed by an injection molding process, an etching process or the like, although the disclosure is not limited thereto.

The body 210 may have an inclined surface at an inner surface thereof. In accordance with the inclination of the inclined surface, the reflection angle of light emitted from the light emitting device 220 may be varied. Thus, the orientation angle of outwardly emitted light may be adjusted.

When viewed from the top side, the cavity, which is formed at the body 210, may have a circular, rectangular, polygonal or elliptical shape. In particular, the cavity may have curved corners. Of course, the cavity is not limited to the above-described shapes.

The light emitting device 220 is mounted on the bottom of the body 210. For example, the light emitting device 220 may be the light emitting device illustrated in FIG. 1 and described with reference to FIG. 1. The light emitting device 220 may be, for example, a colored light emitting device to emit red, green, blue and white light, or an ultraviolet (UV) light emitting device to emit ultraviolet light, although it is not limited thereto. One or more light emitting devices may be mounted.

Meanwhile, the body 210 may include a first lead frame 252 and a second lead frame 254. The first and second lead frames 252 and 254 may be electrically connected to the light emitting device 220, to supply electric power to the light emitting device 220.

The first and second lead frames 252 and 254 are electrically isolated from each other. The first and second lead frames 252 and 254 may function to reflect light generated from the light emitting device 220, thereby enhancing light efficiency. The first and second lead frames 252 and 254 may also outwardly dissipate heat generated from the light emitting device 220.

The first and second lead frames 252 and 254 may be made of at least one of titanium (Ti), copper (Cu), nickel (Ni), gold (Au), chromium (Cr), tantalum (Ta), platinum (Pt), tin (Sn), silver (Ag), phosphor (P), aluminum (Al), indium (In), palladium (Pd), cobalt (Co), silicon (Si), germanium (Ge), hafnium (Hf), ruthenium (Ru), and iron (Fe), or an alloy thereof. The first and second lead frames 252 and 254 may have a single-layer structure or a multilayer structure, although the disclosure is not limited thereto.

The resin material 230 may fill the cavity, and may include a phosphor 240. The resin material 230 may be made of transparent silicon, epoxy resin, or other resin materials.

The kind of the phosphor 240 may be selected in accordance with the wavelength of light emitted from the light emitting device 220 in order to realize emission of white light.

The phosphor 240 contained in the resin material 230 may be a blue, bluish green, green, yellowish green, yellow, yellowish red, orange, or red light-emitting phosphor in accordance with the wavelength of light emitted from the light emitting device 220.

That is, the phosphor 240 may be excited by light emitted from the light emitting device 220 at a first wavelength, to generate light of a second wavelength. For example, when the light emitting device 220 is a blue light emitting diode, and the phosphor 240 is a yellow phosphor, the yellow phosphor is excited by blue light, thereby emitting yellow light. In this case, the light emitting device package 220 may provide white light as the blue light generated from the blue light emitting diode and the yellow light generated in accordance with the excitation by the blue light are mixed.

Similarly, when the light emitting device 220 is a green light emitting diode, a magenta phosphor or a mixture of blue and red phosphors may be used as the phosphor 240. Also, when the light emitting device 220 is a red light emitting diode, a cyan phosphor or a mixture of blue and green phosphors may be used as the phosphor 240.

The phosphor 240 may be a known phosphor such as a YAG-based, TAG-based, sulfide-based, silicate-based, aluminate-based, nitride-based, carbide-based, nitridosilicate-based, borate-based, fluoride-based, or phosphate-based phosphor.

Figure 9:
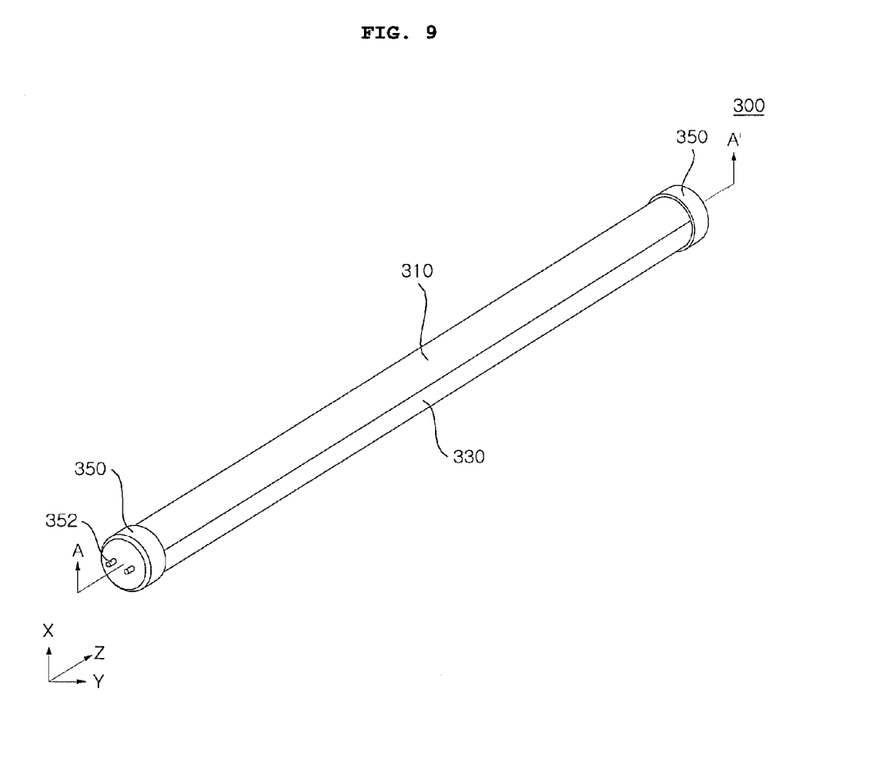
FIG. 9 is a perspective view of a lighting device including a light emitting device in accordance embodiments as broadly described herein.
Figure 10:
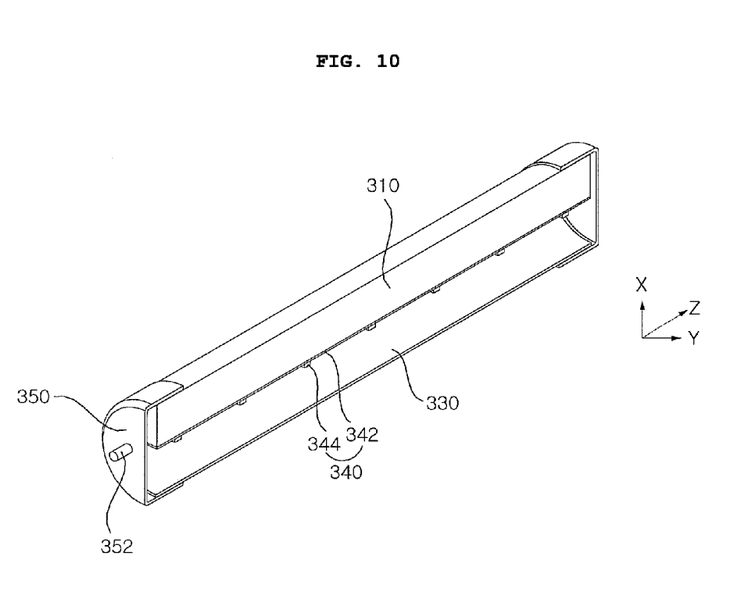
FIG. 10 is a cross-sectional view of the lighting device taken along the line A-A' of the lighting device shown in FIG. 9.

FIG. 9 is a perspective view of a lighting device including a light emitting device in accordance embodiments as broadly described herein, FIG. 10 is a cross-sectional view of the lighting device taken along the line A-A' of the lighting device shown in FIG. 9

Hereinafter, for better understanding, the lighting apparatus 300 will be described based on a longitudinal direction (Z), a horizontal direction (Y) vertical to the longitudinal direction (Z), and a height direction (X) vertical to the longitudinal direction (Z) and the horizontal direction (Y).

That is, FIG. 10 is a cross-sectional view of the lighting apparatus 300 of FIG. 7, taken along the cross-section of the longitudinal direction (Z) and height direction (X) and seen from the horizontal direction (Y).

With Reference to FIGS. 9 and 10, the lighting apparatus 300 may include a body 310, a cover 330 connected to the body 310 and an end cap 350 arranged at both ends of the body 310.

A light emitting device module 340 is connected to the bottom of the body 310 and the body 310 may be composed of a metal which exhibits superior conductivity and excellent heat release effects in order to discharge heat generated from light emitting device packages 344 each having the light emitting device of FIG. 1 (not shown), through an upper surface of the body 310.

The light emitting device packages 344 may be mounted on a printed circuit board (PCB) 342 in multiple rows while having various colors, to form a multi-color array. The light emitting device packages 344 may be mounted at the same distance, or may be mounted at different distances to enable brightness adjustment, if necessary. The PCB 342 may be a metal core PCB (MCPCB) or a flame retardant-4 (FR4) frame.

The cover 330 may have a circular shape to surround the lower surface of the body 310, although the disclosure is not limited thereto.

The cover 330 protects the light emitting device module 340 from external foreign matter, etc. The cover 330 may contain light diffusion particles to achieve anti-glare effects and uniform emission of light generated from the light emitting device packages 344.

At least one of the inner and outer surfaces of the cover 330 may be provided with a prism pattern.

Also, a phosphor layer may be coated over at least one of the inner and outer surfaces of the cover 330.

Since the light generated from the light emitting device packages 344 is outwardly emitted through the cover 330, the cover 330 should have high light transmittance and heat resistance sufficient to endure heat generated from the light emitting device packages 344.

To this end, the cover 330 may be formed of polyethylene terephthalate (PET), polycarbonate (PC) or polymethylmethacrylate (PMMA).

The end cap 350 may be disposed at both ends of the body 310 and function to seal a power supply device (not shown).

Each end cap 350 is provided with power pins 352, so that the lighting apparatus 300 in accordance with the illustrated embodiment may be directly connected to a terminal, which is provided for a conventional fluorescent lamp, without an additional connector.

Figure 11:
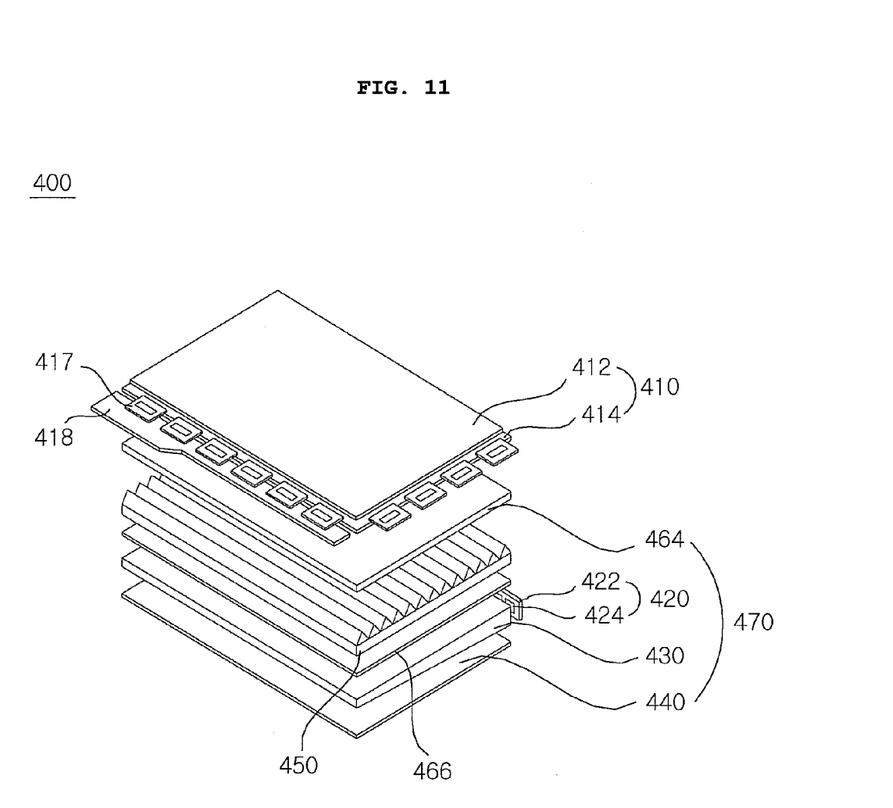
FIG. 11 is a perspective view of a liquid crystal display apparatus including a light emitting device in accordance with an embodiment as broadly described herein.

FIG. 11 is a perspective view of a liquid crystal display apparatus including a light emitting device in accordance with an embodiment as broadly described herein.

FIG. 11 illustrates an edge-light type liquid crystal display apparatus 400 which includes a liquid crystal display panel 410 and a backlight unit 470 to supply light to the liquid crystal display panel 410.

The liquid crystal display panel 410 displays an image using light supplied from the backlight unit 470. The liquid crystal display panel 410 includes a color filter substrate 412 and a thin film transistor substrate 514 which face each other such that a liquid crystal is interposed therebetween.

The color filter substrate 412 can realize color images to be displayed through the liquid crystal display panel 410.

The thin film transistor substrate 414 is electrically connected to a printed circuit board 418 on which a plurality of circuit components is mounted through a driving film 417.

The thin film transistor substrate 414 responds to drive signals supplied from the printed circuit board 418 and may apply drive voltage from the printed circuit board 418 to liquid crystals.

The thin film transistor substrate 414 includes a thin film transistor and a pixel electrode formed as a thin film on other substrates composed of a transparent material such as glass or plastic.

The backlight unit 470 includes a light emitting device module 420 to emit light, a light guide plate 430 to convert light emitted from the light emitting device module 420 into surface light and supply the light to the liquid crystal display panel 410, a plurality of films 450, 466 and 464 to uniformize brightness of light from the light guide plate 430 and improve vertical incidence, and a reflective sheet 440 to reflect light emitted to the back of the light guide plate 430 to the light guide plate 430.

The light emitting device module 420 includes a plurality of light emitting device packages 424 and a PCB 422 on which the light emitting device packages 424 are mounted to form an array.

Meanwhile, each light emitting device package 424 includes a light emitting device, which may be identical to that of FIG. 1 and, as such, no description thereof will be given.

The backlight unit 470 includes a diffusion film 466 to diffuse light incident from the light guide plate 430 toward the liquid crystal display panel 410, a prism film 450 to concentrate the diffused light and thus improve vertical incidence and a protective film 464 to protect the prism film 450.

Figure 12:
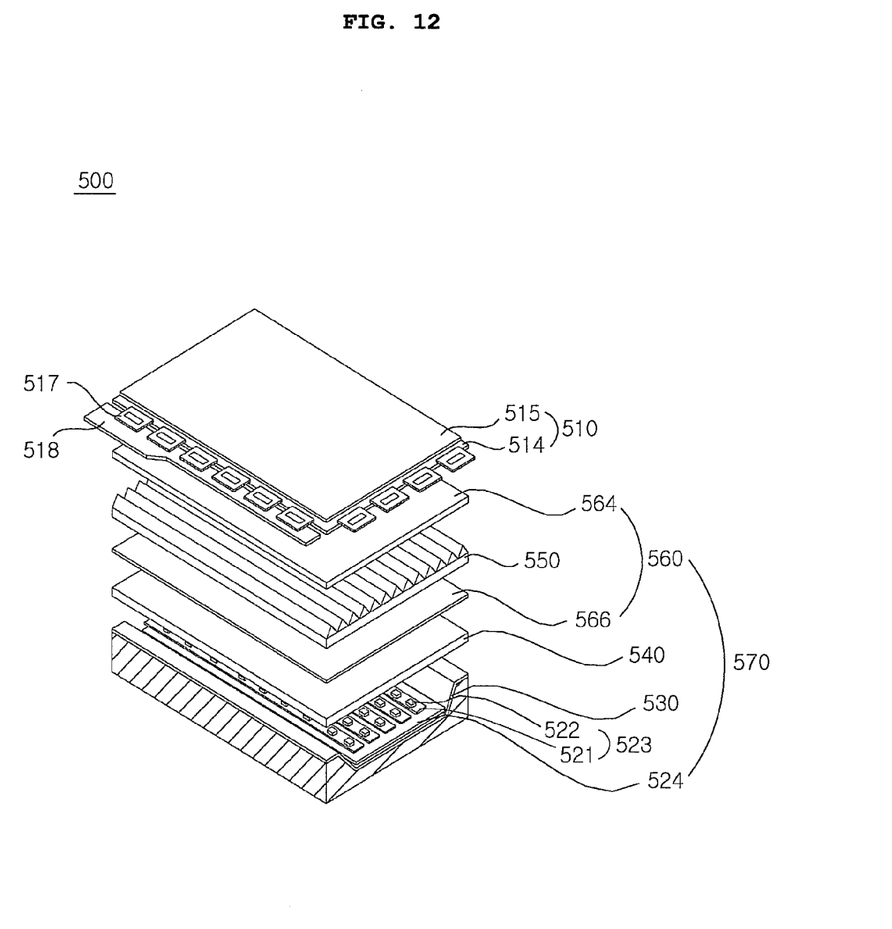
FIG. 12 is a perspective view of a liquid crystal display apparatus including a light emitting device in accordance with another embodiment as broadly described herein.

FIG. 12 is a perspective view of a liquid crystal display apparatus including a light emitting device in accordance with another embodiment as broadly described herein.

The contents illustrated and described in FIG. 11 are not mentioned in detail.

FIG. 12 illustrates a direct-type liquid crystal display apparatus 500 which includes a liquid crystal display panel 510 and a backlight unit 570 to supply light to the liquid crystal display panel 510.

The liquid crystal display panel 510 has been described in FIG. 11 and a detailed explanation thereof is thus omitted.

The backlight unit 570 includes a plurality of light emitting device modules 523, a reflective sheet 524, a lower chassis 530 in which the light emitting device modules 523 and the reflective sheet 524 are accepted, and a diffusion plate 540 and a plurality of optical films 560 arranged on the light emitting device modules 523.

Each light emitting device module 523 includes a plurality of light emitting device packages and a PCB 521 on which the light emitting device packages 524 are mounted to form an array.

The reflective sheet 524 reflects light generated by the light emitting device package 522 toward the liquid crystal display panel 510 to improve luminous efficacy.

Meanwhile, light emitted from the light emitting device module 523 is incident on the diffusion plate 540 and an optical film 560 is arranged on the diffusion plate 540. The optical film 560 includes a diffusion film 566, a prism film 550 and a protective film 564.

The lighting apparatus 400 and liquid crystal display apparatus 500 and 600 may be included in the lighting system and a lighting device including a light emitting device package may be included in the lighting system.

A light emitting device as embodied and broadly described herein may allow which exhibits improved luminous efficacy, stability, improves safety, reliability, and a reduction in the level of operating voltage.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a substrate;
   a reflection electrode disposed on the substrate, the reflection electrode including a first groove;
   a light transmitting electrode disposed on the reflection electrode, the light transmitting electrode including a second groove corresponding to the first groove;
   a current blocking layer disposed in the second groove;
   a light emitting structure disposed on the light transmitting electrode and the current blocking layer, the light emitting structure comprising a first semiconductor layer, a second semiconductor layer, and an active layer interposed between the first and second semiconductor layer; and
   an electrode disposed on the light emitting structure and vertically overlapping at least a portion of the current blocking layer,
   wherein the light transmitting electrode has a thickness of 20 to 200 Å, and
   wherein the light transmitting electrode has bent portions respectively extending in parallel with two opposite lateral side surfaces of the reflection electrode, the bent portions of the light transmitting electrode each being spaced apart from the respective lateral side surface of the reflection electrode, and
   wherein the light transmitting electrode is arranged such that it is in partial contact with both of the two opposite lateral side surfaces of the reflection electrode.

2. The light emitting device of claim 1, further comprising:
   a channel layer interposed between the substrate and the light emitting structure,
   wherein the channel layer is arranged at an outer peripheral region of the light emitting structure.

3. The light emitting device of claim 2, wherein at least a portion of the channel layer is disposed on the light transmitting electrode to overlap with the light transmitting electrode.

4. The light emitting device of claim 1, wherein the light transmitting electrode has a greater width than the reflection electrode.

5. The light emitting device of claim 1, further comprising:
   a bonding layer interposed between the substrate and the reflection electrode, wherein the light transmitting electrode is in contact with the bonding layer at side surfaces of the light transmitting electrode.

6. The light emitting device of claim 1, wherein the light transmitting electrode is made of at least one of indium tin oxide (ITO), aluminum zinc oxide (AZO), and indium zinc oxide (IZO).

7. The light emitting device of claim 1, wherein the reflection electrode is recessed at a portion thereof overlapping with the current blocking layer.

8. The light emitting device of claim 1, wherein the reflection electrode is thicker than the light transmitting electrode.

9. The light emitting device of claim 1, wherein the light transmitting electrode has a thickness of 50 Å.

10. The light emitting device of claim 1, wherein the channel layer forms Schottky contacts in conjunction with the light emitting structure.

11. The light emitting device of claim 1, further comprising:
a passivation layer is formed on side surfaces of the light emitting structure, wherein the passivation layer extends from upper surface portions of the channel layer without vertically overlapping with the light emitting structure to corresponding upper surface portions of the first semiconductor layer along the corresponding side surfaces of the light emitting structure.

12. A light emitting device package, comprising:
a light emitting device, comprising;
a substrate;
a reflection electrode disposed on the substrate, the reflection electrode including a first groove;
a light transmitting electrode disposed on the reflection electrode, the light transmitting electrode including a second groove corresponding to the first groove;
a current blocking layer disposed in the second groove;
a light emitting structure disposed on the light transmitting electrode and the current blocking layer, the light emitting structure comprising a first semiconductor layer, a second semiconductor layer, and an active layer interposed between the first and second semiconductor layer;
an electrode disposed on the light emitting structure and overlapped vertically with at least a portion of the current blocking layer; and
a body comprising a first lead frame, on which the light emitting device is disposed, and a second lead frame spaced apart from the first lead frame,
wherein the light transmitting electrode has a thickness of 20 to 200 Å, and
wherein the light transmitting electrode has bent portions respectively extending in parallel with two opposite lateral side surfaces of the reflection electrode, the bent portions of the light transmitting electrode each being spaced apart from the respective lateral side surface of the reflection electrode, and
wherein the light transmitting electrode is arranged such that it is in partial contact with both of the two opposite lateral side surfaces of the reflection electrode.

13. The light emitting device package of claim 12, wherein the body further comprises:
a cavity formed at a region where the first and second lead frames are disposed; and
a resin material filled in the cavity.

14. The light emitting device package of claim 13, wherein the resin material includes at least one of a phosphor and a light diffusion agent.

15. A lighting system, comprising:
a light emitting device package, comprising:
a light emitting device, the light emitting device comprising a substrate, a reflection electrode disposed on the substrate and including a first groove, a light transmitting electrode disposed on the reflection electrode and including a second groove corresponding to the first groove, a current blocking layer disposed in the second groove, a light emitting structure disposed on the light transmitting electrode and the current blocking layer, the light emitting structure comprising a first semiconductor layer, a second semiconductor layer, and an active layer interposed between the first and second semiconductor layer, and an electrode disposed on the light emitting structure and vertically overlapping at least a portion of the currently blocking layer; and
a circuit board on which the light emitting device package is mounted,
wherein the light transmitting electrode has a thickness of 20 to 200 Å, and
wherein the light transmitting electrode has bent portions respectively extending in parallel with two opposite lateral side surfaces of the reflection electrode, the bent portions of the light transmitting electrode each being spaced apart from the respective lateral side surface of the reflection electrode, and
wherein the light transmitting electrode is arranged such that it is in partial contact with both of the two opposite lateral side surfaces of the reflection electrode.

16. The lighting system of claim 15, wherein the circuit board is at least one of a printed circuit board (PCB), a flexible PCB (FPCB), and a metal core PCB (MCPCB).

* * * * *